(12) United States Patent
Yoon et al.

(10) Patent No.: US 9,362,516 B2
(45) Date of Patent: *Jun. 7, 2016

(54) ORGANIC LIGHT EMITTING DEVICE

(71) Applicant: Samsung Display Co., Ltd., Yongin, Gyeonggi-Do (KR)

(72) Inventors: Ji-Hwan Yoon, Yongin (KR); Kwan-Hee Lee, Yongin (KR); Sung-Jun Bae, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/732,267

(22) Filed: Jun. 5, 2015

(65) Prior Publication Data

US 2015/0280162 A1    Oct. 1, 2015

Related U.S. Application Data

(63) Continuation of application No. 12/368,184, filed on Feb. 9, 2009, now Pat. No. 9,054,318.

(30) Foreign Application Priority Data

Feb. 19, 2008  (KR) .......................... 10-2008-0014906

(51) Int. Cl.
*H01L 51/50*   (2006.01)
*H01L 51/52*   (2006.01)
(Continued)

(52) U.S. Cl.
CPC ............. *H01L 51/5004* (2013.01); *B82Y 10/00* (2013.01); *H01L 51/0047* (2013.01); *H01L 51/506* (2013.01); *H01L 51/5008* (2013.01);
(Continued)

(58) Field of Classification Search
CPC ............ H01L 51/0047; H01L 51/5012; H01L 51/5088
See application file for complete search history.

(56) References Cited

U.S. PATENT DOCUMENTS

| 4,356,429 A | 10/1982 | Tang |
| 2004/0048101 A1 | 3/2004 | Thompson et al. |

(Continued)

FOREIGN PATENT DOCUMENTS

| JP | 2000-196140 | 7/2000 |
| JP | 2005-100921 A | 4/2005 |

(Continued)

OTHER PUBLICATIONS

Japanese Office action dated Sep. 13, 2011, for corresponding Japanese Patent application 2009-036849, (3 pages).

(Continued)

*Primary Examiner* — Elmito Breval
(74) *Attorney, Agent, or Firm* — Lewis Roca Rothgerber Christie LLP

(57) ABSTRACT

An organic light emitting device including a plurality of organic layers between a first electrode and an emitting layer, wherein the organic layer includes an electron blocking layer. In one embodiment, a first organic layer, an electron blocking layer, a second organic layer and an emitting layer are formed on the first electrode. The electron blocking layer has a Lowest Unoccupied Molecular Orbital (LUMO) level which is lower than that of the first organic layer. Thus, the electron blocking layer traps excess electrons injected from the emitting layer, thereby improving lifetime characteristics of the OLED.

18 Claims, 4 Drawing Sheets

(51) Int. Cl.
*B82Y 10/00* (2011.01)
*H01L 51/00* (2006.01)

(52) U.S. Cl.
CPC ........ *H01L 51/5012* (2013.01); *H01L 51/5064* (2013.01); *H01L 51/5088* (2013.01); *H01L 51/5096* (2013.01); *H01L 51/5206* (2013.01); *H01L 51/5221* (2013.01); *H01L 51/006* (2013.01); *H01L 51/0046* (2013.01); *H01L 51/0059* (2013.01); *H01L 51/0072* (2013.01); *H01L 51/0077* (2013.01); *H01L 51/0085* (2013.01); *H01L 51/5048* (2013.01); *H01L 2251/301* (2013.01); *H01L 2251/308* (2013.01); *H01L 2251/552* (2013.01)

(56) References Cited

U.S. PATENT DOCUMENTS

| | | |
|---|---|---|
| 2004/0113546 A1 | 6/2004 | Forrest et al. |
| 2005/0142384 A1 | 6/2005 | Itai |
| 2005/0147846 A1 | 7/2005 | Marks et al. |
| 2006/0006796 A1 | 1/2006 | Lee et al. |
| 2006/0024526 A1 | 2/2006 | Thompson et al. |
| 2006/0076885 A1 | 4/2006 | Kim et al. |
| 2006/0175957 A1 | 8/2006 | Suzuri et al. |
| 2006/0226770 A1 | 10/2006 | Lee et al. |
| 2006/0227079 A1 | 10/2006 | Kashiwabara |
| 2006/0228543 A1 | 10/2006 | Lu et al. |
| 2006/0257685 A1 | 11/2006 | Thompson et al. |
| 2007/0009762 A1 | 1/2007 | Hamada et al. |
| 2007/0231503 A1 | 10/2007 | Hwang et al. |
| 2008/0149178 A1 | 6/2008 | Reyes-Reyes et al. |
| 2008/0223445 A1 | 9/2008 | Marks et al. |
| 2008/0315753 A1 | 12/2008 | Liao et al. |
| 2009/0066223 A1 | 3/2009 | Yabe et al. |
| 2009/0096354 A1 | 4/2009 | Vaufrey et al. |

FOREIGN PATENT DOCUMENTS

| | | |
|---|---|---|
| JP | 2006-041020 A | 2/2006 |
| JP | 2006-114903 | 4/2006 |
| JP | 2007-012946 | 1/2007 |
| KR | 10-2006-0002730 A | 1/2006 |
| KR | 10-2006-0108332 A | 10/2006 |
| KR | 10-2007-0016662 | 2/2007 |
| WO | WO 2004/091262 A1 | 10/2004 |
| WO | WO 2005/009088 A1 | 1/2005 |

OTHER PUBLICATIONS

Japanese Office action dated Jul. 10, 2012, for corresponding Japanese Patent application 2009-036849, (2 pages).
JPO Office Action dated Apr. 16, 2013 for Japanese Patent Application No. 2009-36849, (4 pages).
JPO Office action dated Sep. 3, 2013, for corresponding Japanese Patent application 2012-248673, (4 pages).
Kato, et al., *Organic Light-Emitting Diodes with a Nanostructured Fullerene Layer at the Interface between Alq$_3$ and TPD Layers*, Japanese Journal of Applied Physics, vol. 42, (2003), pp. 2526-2529.
KIPO Office action dated Mar. 31, 2009, for priority Korean application 10-2008-0014906.
Korean Registration Determination Certificate dated Sep. 30, 2009, for priority Korean application 10-2008-0014906.
U.S. Notice of Allowance dated Jul. 23, 2014, for U.S. Appl. No. 14/274,566, (14 pages).

ORGANIC LIGHT EMITTING DEVICE

CROSS-REFERENCE TO RELATED PATENT APPLICATION

This application is a continuation of U.S. patent application Ser. No. 12/368,184, filed Feb. 9, 2009, which claims priority to and the benefit of Korean Patent Application No. 10-2008-0014906, filed Feb. 19, 2008, the entire content of each of which is incorporated herein by reference.

BACKGROUND OF THE INVENTION

1. Field of the Invention

The present invention relates to an organic light emitting device (OLED) including an anode electrode, an organic layer and a cathode electrode stacked on a substrate.

2. Description of the Related Art

Organic light emitting devices (OLEDs), which are self-emitting devices, have wide viewing angles, excellent contrast, and quick response, and thus have received a large amount of public attention. Because OLEDs have low operating voltage and quick response, and can realize multi colors, much research thereon has been carried out.

Typically, an OLED has an anode electrode/organic layer/cathode electrode structure. The organic layer functions as an emitting layer (EML). In addition, the organic layer may be formed of a plurality of layers to further include functions of a hole injection layer (HIL), a hole transport layer (HTL) and an electron injection layer (EIL) as well as the EML.

However, OLEDs cannot be easily applied to certain products because reliability and lifetime (lifespan) characteristics of OLEDs are not suitable for these products.

SUMMARY OF THE INVENTION

An aspect of an embodiment of the present invention is directed toward an organic light emitting device (OLED) having improved lifetime (lifespan) characteristics.

According to an embodiment of the present invention, there is provided an organic light emitting device (OLED) including: a first electrode, a second electrode; an emitting layer formed between the first electrode and the second electrode; an organic layer formed between the emitting layer and the first electrode; and an electron blocking layer (an interlayer or an electron trapping layer) formed between the emitting layer and the organic layer and having a lowest unoccupied molecular orbital (LUMO) level which is lower than that of the organic layer.

The electron blocking layer may include a fullerene compound.

The organic layer may be a hole injection layer or a hole transport layer.

According to another embodiment of the present invention, there is provided an organic light emitting device (OLED) including: a first electrode; a second electrode; an emitting layer formed between the first electrode and the second electrode; a plurality of organic layers formed between the first electrode and the emitting layer; and an electron blocking layer formed between the plurality of organic layers.

The electron blocking layer may not be in direct contact with the first electrode.

The plurality of organic layers may include a first organic layer formed on the first electrode and a second organic layer formed on the first organic layer, wherein the electron blocking layer is disposed between the first organic layer and the second organic layer and has a lowest unoccupied molecular orbital (LUMO) level which is lower than that of the first organic layer.

The first organic layer may be a hole injection layer or a hole transport layer.

The second organic layer may be a hole injection layer or a hole transport layer.

The electron blocking layer may include a fullerene compound.

The OLED may further include a hole injection layer between the first organic layer and the first electrode, wherein the first organic layer and the second organic layer are hole transport layers.

The OLED may further include a hole transport layer between the second organic layer and the emitting layer, wherein the first organic layer and the second organic layer are hole injection layers.

The plurality of organic layers may include a first organic layer, a second organic layer, a third organic layer and a fourth organic layer stacked on the first electrode, and the electron blocking layer may include a first electron blocking layer formed between the first organic layer and the second organic layer, and a second electron blocking layer formed between the third organic layer and the fourth organic layer.

The first electron blocking layer may have a lowest unoccupied molecular orbital (LUMO) level which is lower than that of the first organic layer.

The second electron blocking layer may have a lowest unoccupied molecular orbital (LUMO) level which is lower than that of the first organic layer or the third organic layer, or is lower than that of the LUMO levels of the first organic layer and the third organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
FIG. 1 is a cross-sectional view schematically illustrating a structure of an organic light emitting device (OLED) according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a cross-sectional view schematically illustrating a structure of an organic light emitting device (OLED) according to an embodiment of the present invention. Referring to FIG. 1, the OLED according to the current embodiment of the present invention includes a substrate, a first electrode, a hole injection layer (HIL), an electron blocking layer (EBL), a hole transport layer (HTL), an emitting layer (EML), an electron transport layer (ETL), an electron injection layer (EIL) and a second electrode. Here, in one embodiment, the ETL and/or the EIL may optionally and/or not be included in the OLED, if desired. In addition, according to the structure shown in FIG. 1, an organic layer, disposed between the emitting layer (EML) and the first electrode, includes the electron blocking layer (EBL); and, more particularly, the EBL is interposed between the hole injection layer (HIL) and the hole transport layer (HTL).

The substrate may be any suitable substrate that can be used in OLEDs. In particular, the substrate may be a glass substrate and/or a transparent plastic substrate that has high mechanical strength, thermal stability, transparency, surface smoothness, can be easily treated, and is waterproof. A planarization layer and/or an insulating layer may further be interposed between the substrate and the first electrode, if required.

The first electrode is formed on the substrate, and may be patterned according to requirements of red, green and blue (R, G, B) sub pixels. The first electrode is an anode in the current embodiment, and may be a transparent electrode, a semi-transparent electrode or a reflective electrode. A material used to form the first electrode may be ITO, IZO, $SnO_2$, ZnO, or the like, but is not limited thereto. In addition, the first electrode may have a structure having at least two layers using at least two materials and/or other structures.

The HIL, which is an organic layer, may be selectively formed by thermal vacuum deposition and/or spin coating. The HIL may be formed of a material that can be suitably used to form a HIL. For example, the material used to form the HIL may be a phthalocyanine compound, such as copperphthalocyanine disclosed in US patent (U.S. Pat. No. 4,356,429); a star-burst type amine derivative, such as TCTA, m-MTDATA, and m-MTDAPB, disclosed in Advanced Material, 6, p. 677 (1994); a soluble and conductive polymer such as polyaniline/dodecylbenzenesulfonic acid (Pani/DBSA); poly(3,4-ethylenedioxythiophene)/poly(4-styrenesulfonate) (PEDOT/PSS): polyaniline/camphor sulfonic acid (Pani/CSA); (polyaniline)/poly(4-styrenesulfonate) (PANI/PSS); or the like, but is not limited thereto.

For example, TCTA and m-MTDATA may be respectively represented by Formulae 1 and 2 below.

Formula 1

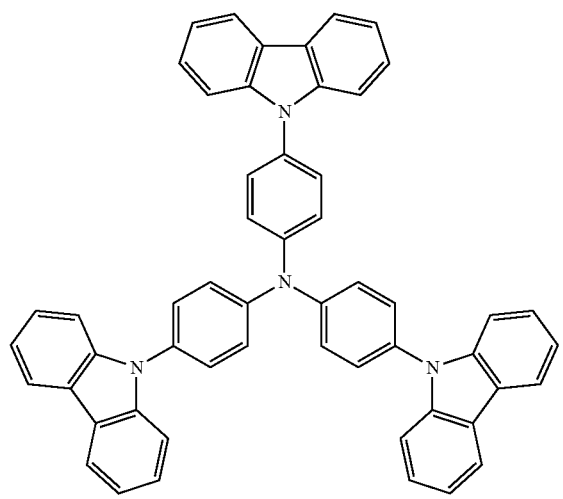

TCTA

Formula 2

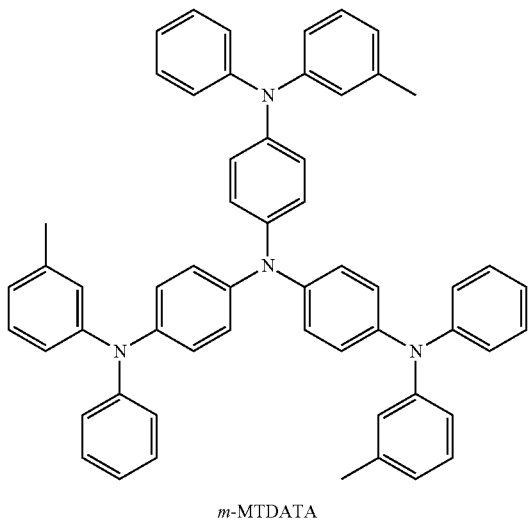

m-MTDATA

The EBL is formed on the HIL. The EBL has a lowest unoccupied molecular orbital (LUMO) level which is lower than that of the HIL. Accordingly, the EBL may trap excess electrons passing through the EML. In particular, the EBL inhibits excess electrons from flowing into the HIL, thereby improving lifetime characteristics.

The EBL needs to be formed of a material having a LUMO level which is lower than that of the HIL. In this regard, the EBL may be formed of a fullerene compound, for example, C60, C70, C76, C78, C82, C84, C90, C96, or the like.

Furthermore, the EBL may be formed of a derivative of the fullerene compound having a substituent. The substituent may be a hydrogen atom, a halogen atom, an alkyl group, an aryl group, an alkenyl group, a haloalkyl group, a cyano group, an alkoxy group, a dialkyl amino group, a diaryl amino group, an aromatic cyclichydrocarbon group, or the like.

The halogen atom may be a fluorine atom, a chlorine atom, a bromine atom, or the like.

The alkyl group may be a straight-chain or branched-chain group having from 1 to 8 carbon atoms such as a methyl group, an ethyl group, a propyl group, a hexyl group, an octyl group, or the like.

The aryl group may be an aliphatic cyclichydrocarbon group having from 7 to 20 carbon atoms such as a benzyl group, a phenyl group, or the like.

The alkenyl group may have from 2 to 7 carbon atoms and may be an ethylene group, a propylene group, a butylene group, a xylene group, or the like.

The haloalkyl group may have from 1 to 4 carbon atoms and may be a fluoromethyl group.

The alkoxy group may be a straight-chain or branched-chain group having from 1 to 6 carbon atoms such as an ethoxy group, a butoxy group, a hexyloxy group, or the like.

The dialkyl amino group may have from 1 to 6 carbon atoms and may be a dimethyl amino group, a diethyl amino group, or the like.

The diaryl amino group may have from 6 to 10 carbon atoms and may be a diphenyl amino group, or the like.

The aromatic cyclichydrocarbon group may have from 6 to 20 carbon atoms and may be a phenyl group, a naphthyl group, an anthryl group, a phenanthryl group, a pyrenyl group, a perylenyl group, or the like.

The aromatic cyclichydrocarbon group may have a substituent. Here, the substituent may be a halogen atom, an alkyl group, an aryl group, an alkenyl group, a haloalkyl group, a cyano group, an alkoxy group, a dialkyl amino group, a diaryl amino group, or the like.
For example, the C60 and derivatives thereof may include compounds represented by Formulae 3 to 13 below.
Formula 3
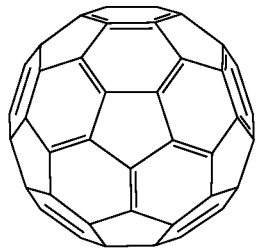
Formula 4
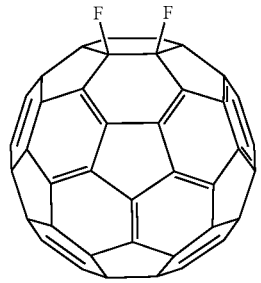
Formula 5
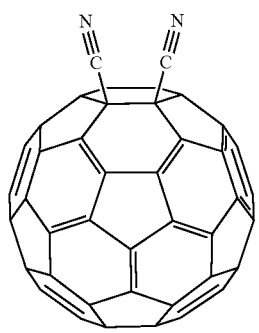
Formula 6
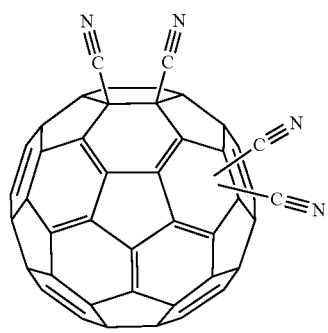
Formula 7
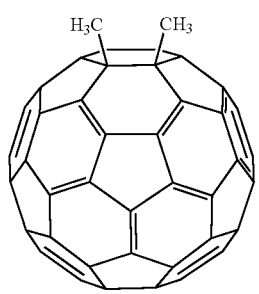
Formula 8
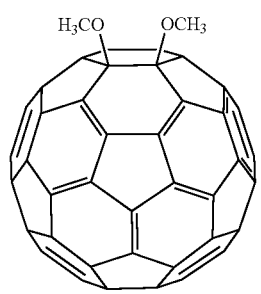
Formula 9
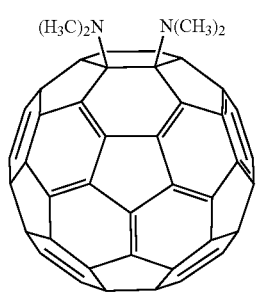
Formula 10
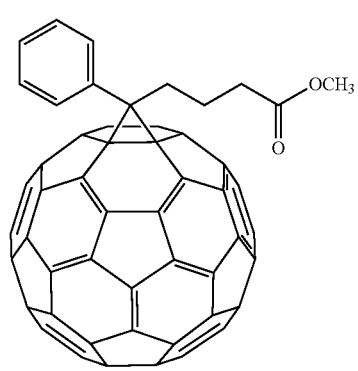

Formula 11

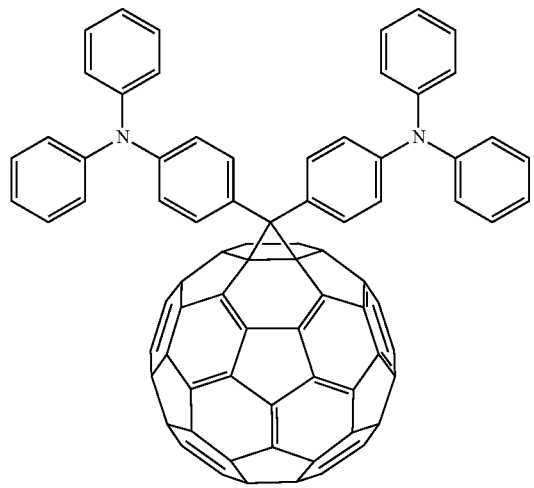

Formula 12

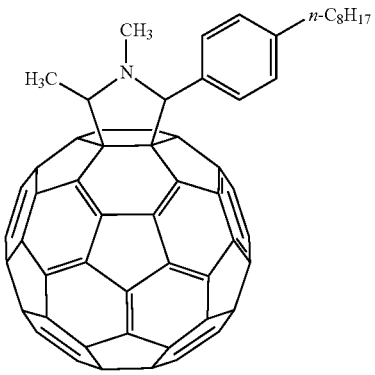

Formula 13

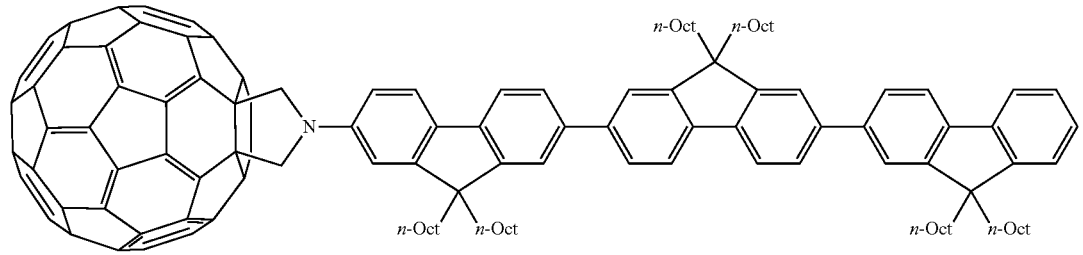

In addition, the ETL may further include a material that further lowers the LUMO level of the fullerene compound. For example, the fullerene compound may further include an alkali metal.

Such an EBL may be formed using a wet coating method such as thermal vacuum deposition, spin coating, inkjet printing, spray coating and/or dip coating.

The HTL is formed on the EBL. The HTL, which is also an organic layer, may be formed by vacuum deposition, spin coating, casting, Langmuir Blodgett (LB) deposition, or the like. In one embodiment, vacuum deposition is utilized because a uniform layer can be obtained and pin holes are prevented or reduced by the vacuum deposition. When the HTL is formed by vacuum deposition, conditions for vacuum deposition are similar to those for the formation of the HIL, although conditions for the deposition and coating may vary according to the material that is used to form the HTL.

Examples of a material that can be used to form the HTL are N,N'-bis(3-methylphenyl)-N,N'-diphenyl-[1,1-biphenyl]-4,4'diamine (TPD) and N,N'-di(naphthalene-1-il)-N,N'-diphenyl benzidine (α-NPD), but are not limited thereto.

The EML is formed on the HTL. A material that is used to form the EML may be: a blue dopant such as oxadiazole dimer dyes (Bis-DAPDXP)), spiro compounds (Spiro-DPVBi, Spiro-6P), triarylamine compounds, bis(styryl) amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)(BCzVB), 4,4-bis[4-(di-p-tolylamino)styryl]biphenyl (DPAVBi), 4-(di-p-tolylamino)-4'-[(di-p-tolylamino)styryl]benzene (DPAVB), 4,4'-bis[4-(diphenylamino)styryl]biphenyl (BDAVBi), and bis(3,5-difluoro-2-(2-pyridyl)phenyl-(2-carboxypyridyl)iridium III (FlrPic); a green dopant such as 3-(2-benzothiazolyl)-7-(diethylamino)coumarin (Coumarin 6) 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), and tris(2-phenylpyridine)iridium (III) (Ir(ppy)$_3$); or a red dopant such as tetraphenylnaphthacene (Rubrene), tris(1-phenyl-isoquinoline)iridium (III) (Ir(piq)$_3$), bis(2-benzo[b]thiophen-2-yl-pyridine) (acetylacetonate)iridium (III) (Ir(btp)$_2$(acac)), tris (dibenzoylmethane)phenanthroline europium (III) (Eu (dbm)$_3$(phen)), tris[4,4'-di-tert-butyl-(2,2')-bipyridine] ruthenium (III) complex (Ru(dtb-bpy)$_3$*2(PF$_6$)), DCM1, DCM2, Eu(thenoyltrifluoroacetone)3 (Eu(TTA)3 and butyl-6-(1,1,7,7-tetramethyljulolidyl-9-enyl)-4H-pyran (DCJTB), but is not limited thereto. A light emitting polymer may be an aromatic compound including nitrogen and a polymer such as phenylene, phenylene vinylene, thiophen, fluorene and spirofluorene, but is not limited thereto.

If desired, the EML may further include a light emitting host and a light emitting dopant. The light emitting host may be a phosphorescent host or a fluorescent host. The fluorescent host may be tris(8-hydroxy-quinorate)aluminum (Alq3), 9,10-di(naphthyl-2-yl)anthracene (AND), 3-tert-butyl-9,10-di(naphthyl-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), Tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), or the like. The phosphorescent host may be 1,3-bis(carbazole-9-yl)benzene (mCP), 1,3,5-tris(carbazole-9-yl)benzene (tCP), 4,4',4"-tris (carbazole-9-yl)triphenylamine (TcTa), 4,4'-bis(carbazole-9-yl)biphenyl (CBP), 4,4'-bis(9-carbazoleyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The amount of the light emitting dopant may vary according to the material that is used to form the EML. However, typically, the amount of the light emitting dopant may be in the range from about 30 to about 80 parts (or from 30 to 80 parts) by weight based on 100 parts by weight of the material used to form the EML (the total weight of the host and the dopant). In one embodiment, if the amount of the light emitting dopant is not within the above range, emitting characteristics of the organic light emitting device may decrease.

The EML may be formed by vacuum deposition, spin coating, casting, LB deposition, or the like.

The ETL is formed on the EML. The ETL may be formed of a material having high electron-transporting capability. Examples of the material used to form the ETL include known ETL materials such as a quinoline derivative, in particular, tris(8-quinolinorate)aluminum (Alq3), TAZ, and Balq, but are not limited thereto. In addition, the material used to form the ETL may be bis(10-hydroxybenzo[h]quinolinato beryllium (Bebq2) represented by Formula 14 below or a derivative thereof. The electron transporting material may also include a metal oxide. The metal oxide may be an oxide of an alkali metal, an alkali earth metal or a transition metal.

Formula 14

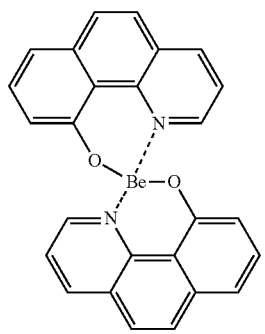

The EIL is formed on the ETL. However, the EIL, which facilitates injection of electrons from the second electrode, may not be included. The EIL may be formed of LiF, NaCl, CsF, $Li_2O$, BaO, or the like.

The ETL and EIL may be formed by vacuum deposition, spin coating, casting, or the like. When the ETL and EIL are formed by vacuum deposition, conditions for vacuum deposition are similar to those for the formation of the HIL, although conditions for the deposition may vary according to the material that is used to form the ETL and EIL.

The second electrode, as a cathode electrode, is formed on the EIL. The second electrode may be formed of a low work-function metal, an alloy, an electrically conductive compound, or a combination thereof. In more detail, the second electrode may be formed of Li, Mg, Al, Al—Li, Ca, Mg—In, Mg—Ag, or the like. In addition, the second electrode may be formed of a transparent material such as ITO or IZO to produce a front surface organic light emitting device.

The second electrode may be formed by vacuum deposition, sputtering, or the like.

In the structure of the OLED having the EBL between the HIL and the HTL as described above, the EBL can trap electrons because it has a lower LUMO level than that of the HIL. Thus, the EBL can prevent (or block) excess current passing through the EML from flowing into the HIL, thereby improving lifetime characteristics.

Hereinafter, various structures of OLEDs according to embodiments of the present invention will be described with reference to the arrangement of a HTL between an EML and an electrode, and an EBL between a HIL and an organic layer.

Here, the organic layers according to embodiments of the present invention may include HIL and HTL.

Materials for each of the layers and methods of manufacturing the layers are the same (or substantially the same) as those described with reference to FIG. 1, and thus descriptions thereof will not be repeated. Hereinafter, structures of the OLEDs which are different from the structure of FIG. 1 will be described in more detail below.

Figure 2:
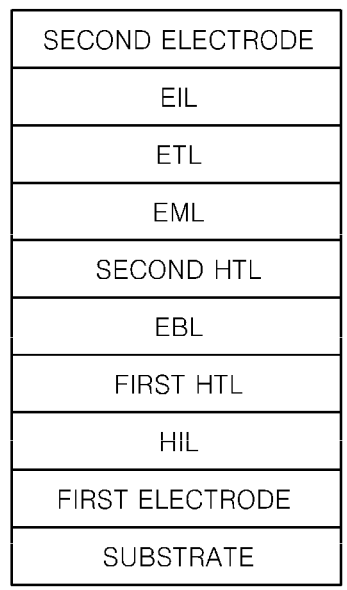
FIG. 2 is a cross-sectional view schematically illustrating a structure of an OLED according to another embodiment of the present invention.

FIG. 2 is a cross-sectional view schematically illustrating a structure of an OLED according to another embodiment of the present invention. Referring to FIG. 2, the OLED according to the current embodiment includes a plurality of HTLs formed between a first electrode and an EML. That is, a first HTL is formed on the first electrode, and a second HTL is formed on the first HTL. In addition, an EBL is formed between the first HTL and the second HTL.

Since the EBL has a lower LUMO level than that of the first HTL, excess current passing through the EML is inhibited from flowing into the first HTL.

The first HTL and the second HTL may be formed of the same material or different materials. When they are formed of different materials, the materials may be appropriately selected in order to facilitate transport of injected holes to the EML.

Figure 3:
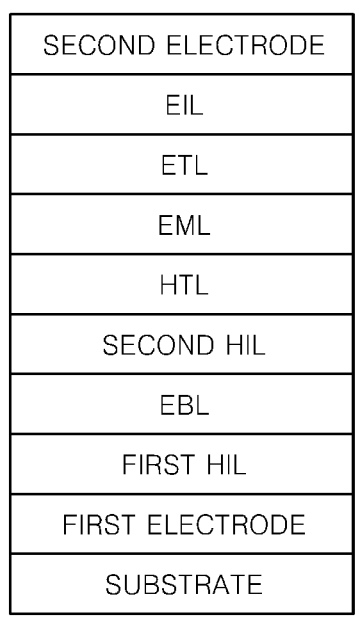
FIG. 3 is a cross-sectional view schematically illustrating a structure of an OLED according to another embodiment of the present invention.

FIG. 3 is a cross-sectional view schematically illustrating a structure of an OLED according to another embodiment of the present invention. Referring to FIG. 3, the OLED according to the current embodiment includes a plurality of HILs and an EBL formed between the first and second HILs.

In more detail, a first HIL is formed on a first electrode, an EBL is formed on the first HIL, and a second HIL is formed on the EBL. Then, a HTL and an EML are formed on the second HIL. The HTL may not be formed, as desired.

Since the EBL has a lower LUMO level than that of the first HIL, excess electrons injected from the EML are substantially trapped in the EBL. Thus, lifetime characteristics of the OLED can be improved.

Figure 4:
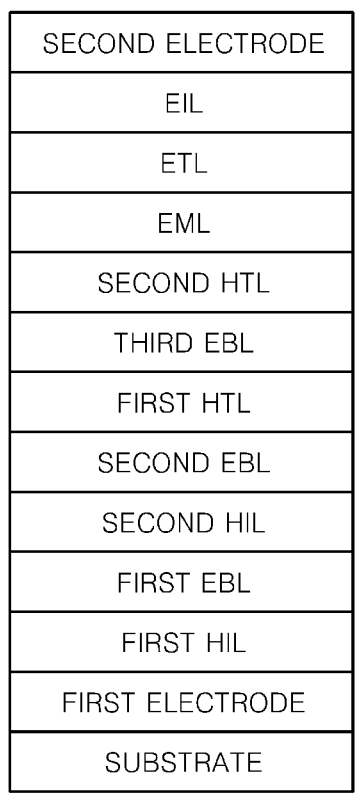
FIG. 4 is a cross-sectional view schematically illustrating a structure of an OLED according to another embodiment of the present invention.

FIG. 4 is a cross-sectional view schematically illustrating a structure of an OLED according to another embodiment of the present invention. Referring to FIG. 4, the OLED according to the current embodiment includes a plurality of HILs, a plurality of HTLs and a plurality of EBLs.

In more detail, a first HIL is formed on a first electrode, a first EBL is formed on the first HIL, and a second HIL is formed on the first EBL. Since the first EBL has a lower LUMO level than that of the first HIL, excess electrons are trapped in the first EBL.

Then, a second EBL is formed on the second HIL, and a first HTL is formed on the second EBL. Since the second EBL has a lower LUMO level than that of the second HIL, excess electrons are inhibited from flowing into the second HIL.

A third EBL, a second HTL and an EML are sequentially stacked on the first HTL. Since the third EBL has a lower LUMO level than that of the first HTL, excess electrons are inhibited from flowing into the first HIL.

Any suitable structure is within the scope of the present invention as long as the EBL is interposed between the HTLs, and/or the HTLs are interposed between the EML and the first electrode. However, the EBL should not be in contact with the first electrode and needs to have a lower LUMO level than that of an organic layer, such as a HTL or HIL, which is closer to the first electrode.

Figure 5:
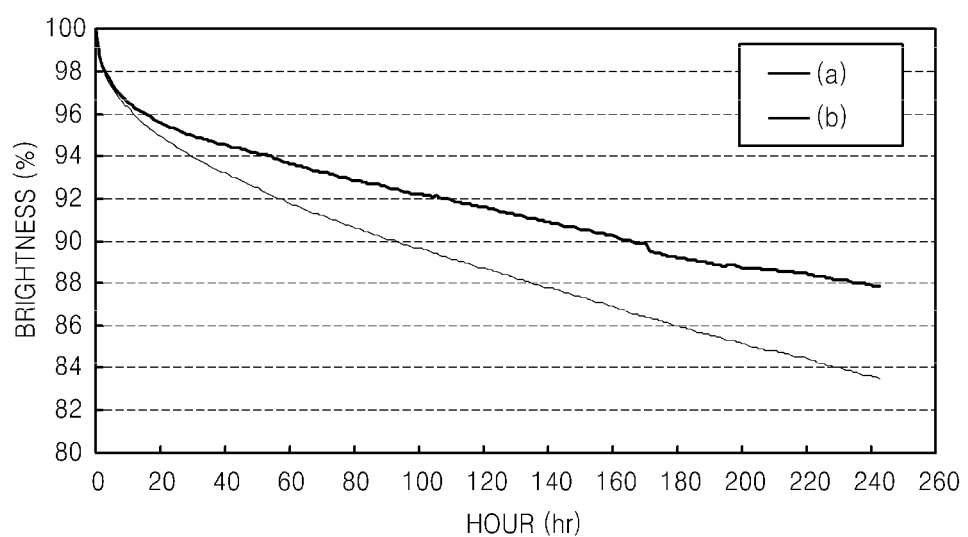
FIG. 5 is a time-brightness graph illustrating lifetime characteristics of an OLED according to an embodiment of the present invention.

Hereinafter, the present invention will be described in more detail with reference to examples evaluating lifetimes of OLEDs according to the present invention. FIG. 5 is a time-brightness graph illustrating lifetime characteristics of an OLED according to an embodiment of the present invention.

An OLED according to an embodiment of the present invention (Experimental Example) and an OLED not including an electron blocking layer (EBL) (Comparative Example) were manufactured in order to evaluate lifetime characteristics of the OLEDs.

EXPERIMENTAL EXAMPLE

An OLED having a structure described below was manufactured.

A corning 15 Ω/cm² (1200 Å) ITO glass substrate (Corning) was cut into pieces of 50 mm×50 mm×0.7 mm in size, then the pieces were ultrasonic cleaned in isopropyl alcohol and deionized water for 5 minutes for each of the pieces, and then the pieces were washed with UV and ozone for 30 minutes to be used as a first electrode, i.e., an anode electrode. The ITO glass substrate was fixed in a vacuum deposition device.

Then, m-MTDATA was vacuum deposited to a thickness of 500 Å on the ITO substrate to form a HIL. C60 was vacuum deposited to a thickness of 50 Å to form an EBL. NPD was vacuum deposited on the HIL to a thickness of 200 Å as HTL. Then, an EML was formed to a thickness of 400 Å by vacuum depositing CBP as a host and PQ2Ir(acac) as a dopant on the HTL. Then, Alq3 was deposited to a thickness of 300 Å on the EML to form an ETL, and LiF was deposited on the ETL to a thickness of 5 Å to form an EIL. Then, Al was vacuum deposited on the EIL to a thickness of 1000 Å to form a second electrode, i.e., a cathode electrode.

COMPARATIVE EXAMPLE

An OLED was manufactured in the same (or substantially the same) manner as in Experimental Example, except that an EBL was not formed.

EVALUATION EXAMPLE

Evaluation of Lifetime Characteristics of the OLEDs

Brightness of the OLEDs manufactured in Experimental Example and Comparative Example was evaluated using a PR650 (Spectroscan spectrometer, PHOTO RESEARCH INC.), and the results are shown in FIG. 5. FIG. 5 illustrates brightness according to time when the initial brightness of the OLEDs was regarded as 100%.

According to FIG. 5, when the brightness reliability was 90%, the lifetime of the OLED manufactured according to the Experimental Example was about 170 hours (a), and the lifetime of the OLED manufactured according to the Comparative Example was about 95 hours (b). Thus, the OLED according to the Experiment Example of the present invention has relatively longer lifetime characteristics.

As described above, the OLED according to embodiments of the present invention includes organic layers (e.g., HIL and/or HTL) between the EML and the first electrode, and an EBL between the EML and one or more of the organic layers (e.g., HIL). Thus, excess electrons passing through the EML are inhibited from flowing into the HIL, thereby improving lifetime characteristics.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting device (OLED) comprising:
a first electrode;
a second electrode;
an emitting layer between the first electrode and the second electrode;
a hole injection layer between the emitting layer and the first electrode; and
an interlayer between the emitting layer and the hole injection layer and having a lowest unoccupied molecular orbital (LUMO) level lower than that of the hole injection layer,
wherein the interlayer is directly on the hole injection layer.

2. The OLED of claim 1, wherein the interlayer comprises a fullerene compound.

3. An organic light emitting device (OLED) comprising:
a first electrode;
a second electrode;
an emitting layer between the first electrode and the second electrode;
a plurality of hole injection layers between the first electrode and the emitting layer; and
an interlayer between the plurality of hole injection layers, wherein the interlayer comprises a fullerene compound,
wherein the interlayer is directly on the hole injection layer,
wherein the plurality of hole injection layers comprise a first hole injection layer on the first electrode and a second hole injection layer on the first hole injection layer; and
wherein the interlayer is between the first hole injection layer and the second hole injection layer and has a lowest unoccupied molecular orbital (LUMO) level lower than that of the first hole injection layer.

4. The OLED of claim 3, wherein the interlayer is not in direct contact with the first electrode.

5. The OLED of claim 3, further comprising a hole transport layer between the second hole injection layer and the emitting layer.

6. The OLED of claim 3, further comprising a first hole transport layer and a second hole transport layer,
wherein the plurality of hole injection layers comprise a first hole injection layer, and a second hole injection layer, and
the interlayer comprises a first interlayer between the first hole injection layer and the second hole injection layer, a second interlayer formed between the second hole injection layer and the first hole transport layer, and a third interlayer formed between the first hole transport layer and the second hole transport layer.

7. The OLED of claim 6, wherein the first interlayer has a lowest unoccupied molecular orbital (LUMO) level lower than that of the first hole injection layer.

8. The OLED of claim 6, wherein the second interlayer has a lowest unoccupied molecular orbital (LUMO) level lower than that of the first hole injection layer or the first hole transport layer.

9. An organic light emitting device (OLED) comprising:
a first electrode;
a second electrode;
an emitting layer between the first electrode and the second electrode;
a hole injection layer between the emitting layer and the first electrode; and
an interlayer between the emitting layer and the hole injection layer and having a lowest unoccupied molecular orbital (LUMO) level lower than that of the hole injection layer, wherein the interlayer is a single layer, and
wherein the interlayer is directly on the hole injection layer.

10. An organic light emitting device (OLED) comprising:
a first electrode;
a second electrode;
an emitting layer between the first electrode and the second electrode;
a hole injection layer between the emitting layer and the first electrode; and
an electron trapping layer between the emitting layer and the hole injection layer and having a lowest unoccupied molecular orbital (LUMO) level lower than that of the hole injection layer,
wherein the electron trapping layer is directly on the hole injection layer.

11. The OLED of claim 10, wherein the electron trapping layer comprises a fullerene compound.

12. An organic light emitting device (OLED) comprising:
a first electrode;
a second electrode;
an emitting layer between the first electrode and the second electrode;
a plurality of hole injection layers between the first electrode and the emitting layer; and
an electron trapping layer between the plurality of hole injection layers, wherein the electron trapping layer comprises a fullerene compound,
wherein the electron trapping layer is directly on the hole injection layer,
wherein the plurality of hole injection layers comprise a first hole injection layer on the first electrode and a second hole injection layer on the first hole injection layer; and
wherein the electron trapping layer is between the first hole injection layer and the second hole injection layer and has a lowest unoccupied molecular orbital (LUMO) level lower than that of the first hole injection layer.

13. The OLED of claim 12, wherein the electron trapping layer is not in direct contact with the first electrode.

14. The OLED of claim 12, further comprising a hole transport layer between the second hole injection layer and the emitting layer.

15. The OLED of claim 12, further comprising a first hole transport layer and a second hole transport layer,
wherein the plurality of hole injection layers comprise a first hole injection layer, and a second hole injection layer, and
the electron trapping layer comprises a first electron trapping layer between the first hole injection layer and the second hole injection layer, a second electron trapping layer formed between the second hole injection layer and the first hole transport layer, and a third electron trapping layer formed between the first hole transport layer and the second hole transport layer.

16. The OLED of claim 15, wherein the first electron trapping layer has a lowest unoccupied molecular orbital (LUMO) level lower than that of the first hole injection layer.

17. The OLED of claim 15, wherein the second electron trapping layer has a lowest unoccupied molecular orbital (LUMO) level lower than that of the first hole injection layer or the first hole transport layer.

18. An organic light emitting device (OLED) comprising:
a first electrode;
a second electrode;
an emitting layer between the first electrode and the second electrode;
a hole injection layer between the emitting layer and the first electrode; and
an electron trapping layer between the emitting layer and the hole injection layer and having a lowest unoccupied molecular orbital (LUMO) level lower than that of the hole injection layer, wherein the electron trapping layer is a single layer, and
wherein the electron trapping layer is directly on the hole injection layer.

* * * * *